(12) United States Patent
Park

(10) Patent No.: US 9,190,130 B2
(45) Date of Patent: Nov. 17, 2015

(54) SEMICONDUCTOR MEMORY DEVICE WITH SEQUENTIALLY GENERATED DELAY SIGNALS

(71) Applicant: SK hynix Inc., Gyeonggi-do (KR)

(72) Inventor: Heat-Bit Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 185 days.

(21) Appl. No.: 13/717,357

(22) Filed: Dec. 17, 2012

(65) Prior Publication Data

US 2014/0063977 A1 Mar. 6, 2014

(30) Foreign Application Priority Data

Aug. 28, 2012 (KR) .................. 10-2012-0094440

(51) Int. Cl.
*G11C 7/22* (2006.01)
*G11C 7/10* (2006.01)
*G11C 11/4076* (2006.01)
*G11C 11/4097* (2006.01)

(52) U.S. Cl.
CPC .............. *G11C 7/227* (2013.01); *G11C 7/1087* (2013.01); *G11C 11/4076* (2013.01); *G11C 11/4097* (2013.01); *G11C 2207/005* (2013.01); *G11C 2207/229* (2013.01)

(58) Field of Classification Search
CPC ........ G11C 7/22; G11C 7/222; G11C 7/1066; G11C 7/227; G11C 7/1087; G11C 11/4097; G11C 11/4076; G11C 2207/229; G11C 2207/005
USPC ........... 365/193, 194, 230.06, 189.08, 189.05
See application file for complete search history.

(56) References Cited

U.S. PATENT DOCUMENTS

| 5,475,690 | A  | * | 12/1995 | Burns et al. ................... 370/519 |
| 6,243,312 | B1 | * | 6/2001 | Kim .............................. 365/207 |
| 6,246,620 | B1 | * | 6/2001 | Fujioka et al. ................ 365/205 |
| 6,622,256 | B1 | * | 9/2003 | Dabral et al. ................. 713/600 |
| 6,839,291 | B2 | * | 1/2005 | Shin .............................. 365/194 |
| 7,577,046 | B2 | * | 8/2009 | Kwack .......................... 365/193 |
| 7,599,234 | B2 | * | 10/2009 | Nam et al. ..................... 365/194 |
| 2001/0021140 | A1 | * | 9/2001 | Fujioka et al. ........... 365/230.06 |
| 2003/0202385 | A1 | * | 10/2003 | Shin .............................. 365/194 |

(Continued)

FOREIGN PATENT DOCUMENTS

| KR | 1020090072270 | 7/2009 |
| KR | 1020090126611 | 12/2009 |
| KR | 1020110047667 | 5/2011 |

*Primary Examiner* — J. H. Hur
*Assistant Examiner* — Jerome Leboeuf
(74) *Attorney, Agent, or Firm* — IP & T Group LLP

(57) ABSTRACT

A semiconductor memory device includes a first signal generation unit configured to sequentially generate first and second delay signals in response to a first column control signal, the first and second delay signals having reflected a delay time and a multiplied delay time selected from a plurality of delay times in correspondence with an arrangement location of a unit memory region, through data is input/output, respectively, and a second signal generation unit configured to generate a second column control signal delayed by the selected delay time as compared with the first column control signal, to determine an activation time point of the second column control signal in response to the first delay signal, and to determine a deactivation time point of the second column control signal in response to the second delay signal.

24 Claims, 7 Drawing Sheets

(56) References Cited

U.S. PATENT DOCUMENTS

| | | | |
|---|---|---|---|
| 2006/0193171 A1* | 8/2006 | Nam et al. | 365/185.03 |
| 2006/0209602 A1* | 9/2006 | You | 365/191 |
| 2008/0089147 A1* | 4/2008 | Kwack | 365/194 |
| 2011/0103162 A1* | 5/2011 | Park | 365/194 |

* cited by examiner

SEMICONDUCTOR MEMORY DEVICE WITH SEQUENTIALLY GENERATED DELAY SIGNALS

CROSS-REFERENCE TO RELATED APPLICATIONS

The present application claims priority of Korean Patent Application No. 10-2012-0094440, filed on Aug. 28, 2012, which is incorporated herein by reference in its entirety.

BACKGROUND

1. Field

Exemplary embodiments of the present invention relate to a semiconductor design technology, and more particularly, to a semiconductor memory device.

2. Description of the Related Art

In general, a semiconductor memory device such as a dynamic random access memory (DRAM) performs a write operation to store data or a read operation to read stored data.

The write operation may be performed in a stater in which a word line (WL) has been activated by an active command. In the write operation, data loaded on a global input/output line GIO is transferred to a local data input/output line (LIO) by a write driver (WD), the data loaded on the local input/output line (LIO) is transferred to a bit line (BL) selected based on a column selection signal, and then the data loaded on the bit line is stored in a memory cell by a bit line sense amplifier (BLSA).

Meanwhile, the read operation may also be performed in a state in which a word line (WL) has been activated by an active command. In the write operation, data stored in a memory cell is amplified through the bit line sense amplifier (BLSA) through a bit line (BL), the amplified data is transferred to the local input/output line (LIO) based on the column selection signal, and then the data on the local input/output line (LIO) is amplified and transferred to the global input/output line (GIO) by an input/output sense amplifier (IOSA).

As described above, to exchange the data between the local input/output line (LIO) and the bit line sense amplifier (BLSA), the column selection signal for selecting the corresponding bit line (BL) is used. That is, data access timing is determined by the column selection signal.

FIG. 1 is a configuration diagram of a column path control signal generation circuit of a conventional semiconductor memory device.

Referring to FIG. 1, the column path control signal generation circuit 10 includes an inverter chain, and generates predetermined signals BWEN, YI_S, and IOSTBP after respective delay times in response to a source signal BCS. The source signal BCS is activated after each predetermined latency when a write command or a read command is applied.

The column path control signal generation circuit 10 generates a write enable signal BWEN by delaying the source signal BCS by a predetermined delay time in a write operation, and delays the write enable signal BWEN by a first delay time to generate a column source signal YI_S. The write enable signal BWEN is input to a write driver (not illustrated), and the write driver transfers data loaded on a global input/output line GIO to a local input/output line (LIO) based on the write enable signal BWEN. The column source signal YI_S is input to a column decoder (not illustrated), and the column decoder generates a column selection signal (not illustrated) based on the column source signal YI_S and a column address (not illustrated). Hereinafter, for the purpose of convenience, the column source signal YI_S is referred to as "a column selection signal".

The column path control signal generation circuit 10 generates the column selection signal YI_S by delaying the source signal BCS by a predetermined delay time in a read operation, and delays the column selection signal YI_S by a second delay time to generate a read enable signal IOSTBP. The read enable signal IOSTBP is input to an input/output sense amplifier (not illustrated), and the input/output sense amplifier (IOSA) transfers data loaded on the local input/output line (LIO) to the global input/output line (GIO) based on the read enable signal IOSTBP.

Hereinafter, an operation of the column path control signal generation circuit 10 having the configuration as described above will be described with reference to FIG. 2A and FIG. 2B.

FIG. 2A is a timing diagram for explaining the operation of the column path control signal generation circuit 10 in the write operation, and FIG. 2B is a timing diagram for explaining the operation of the column path control signal generation circuit 10 in the read operation.

Referring to FIG. 2A, a write command (not illustrated) is applied and the source signal BCS is activated after predetermined latency. Then, the column path control signal generation circuit 10 generates the write enable signal BWEN by delaying the source signal BCS by a predetermined delay time, and delays the write enable signal BWEN by a first delay time D1 to generate the column selection signal YI_S.

Referring to FIG. 2B, a read command (not illustrated) is applied and the source signal BCS is activated after predetermined latency. Then, the column path control signal generation circuit 10 generates the column selection signal YI_S by delaying the source signal BCS by a predetermined delay time, and delays the column selection signal YI_S by a second delay time D2 to generate the read enable signal IOSTBP.

The aforementioned column path control signal generation circuit 10 in the conventional art sequentially controls column paths, thereby writing and reading valid data.

However, the column path control signal generation circuit 10 having the configuration as described above may have the following concerns.

The column selection signal YI_S generated by the column path control signal generation circuit 10 has not considered delay correction according to the arrangement location of a memory area. For example, when the memory area is assumed to include a plurality of unit memory regions (mats), as a mat is arranged far away from the write driver, driving force of data transmitted through the local input/output line (LIO) is reduced. This is because a delay factor (or line loading) to be reflected in the local input/output line (LIO) is increased in the mat arranged far away from the write driver. Thus, data to be written is delayed in the mat arranged far away from the write driver, but the column selection signal YI_S having reflected a constant delay time D1 regardless of the arrangement locations of the plurality of mats is generated. In such a case, since the column selection signal YI_S is generated later or earlier than a transmission time point of write data based on the arrangement location of the unit memory region, a write recovery time tWR may be lost or invalid data may be written.

Due to the aforementioned reason, the read enable signal IOSTBP may be also generated late or early. In such a case, an address access time tAA may be lost or invalid data may be read.

Furthermore, since the inverter chain typically includes transistors, the inverter chain is sensitive to a process, voltage, and temperature (PVT) variation. For example, in a high power supply voltage high VDD environment, a delay time through the inverter chain is reduced, and in a low power supply voltage low VDD environment, the delay time through the inverter chain is increased, so that the column selection signal YI_S may not be normally generated at a desired timing due to a change in a delay amount by a voltage variation. As a consequence, due to the PVT variation, invalid data may be written or read.

SUMMARY

Exemplary embodiments of the present invention are directed to a semiconductor device for generating a column selection signal having considered the arrangement locations of a plurality of unit memory regions.

Other embodiments of the present invention are directed to a semiconductor device which is insensitive to a PVT variation while generating a column selection signal having considered the arrangement locations of a plurality of unit memory regions.

In accordance with an embodiment of the present invention, a semiconductor memory device includes a first signal generation unit configured to sequentially generate first and second delay signals in response to a first column control signal, the first and second delay signals having reflected a delay time and a multiplied delay time selected from a plurality of delay times in correspondence with an arrangement location of a unit memory regions, through data is input/output, respectively, and a second signal generation unit configured to generate a second column control signal delayed by the selected delay time as compared with the first column control signal, to determine an activation time point of the second column control signal in response to the first delay signal, and to determine a deactivation time point of the second column control signal in response to the second delay signal.

In accordance with another embodiment of the present invention, a semiconductor memory device includes a first replica delay section configured to delay a write enable signal by a delay time corresponding to arrangement locations of a plurality of unit memory regions to generate a first delay signal, a second replica delay section configured to delay the first delay signal by the delay time to generate a second delay signal, a column source signal generation unit configured to generate a first column source signal, which is delayed by the delay time as compared with the write enable signal, in response to the write enable signal and the first and second delay signals, and a column decoder configured to generate a column selection signal for write operation in response to the first column source signal.

In a write operation a generation timing of a column selection signal is adjusted corresponding to the arrangement locations of a plurality of unit memory regions, and in a read operation, a generation timing of a read enable signal is adjusted corresponding to the arrangement locations of the plurality of unit memory regions, so that it is possible to write and read valid data.

Furthermore, since a RC delay is used as a delay factor required when the generation timings of the column selection signal and the read enable signal, even when a PVT variation has occurred, it is possible to generate the column selection signal and the read enable signal at a desired timing.

DETAILED DESCRIPTION

Figure 1:
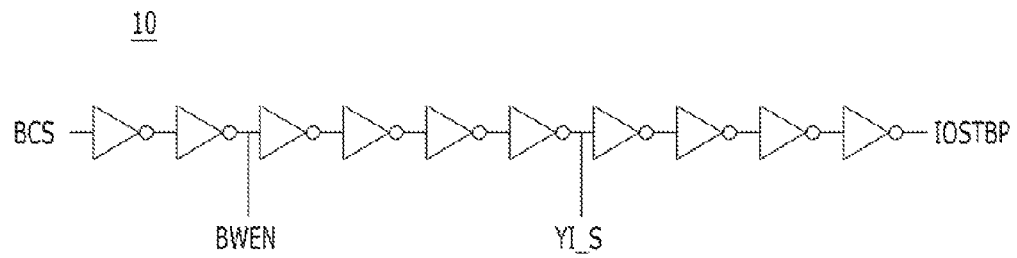
FIG. 1 is a configuration diagram illustrating an example of a semiconductor device in the conventional art.
Figure 2A:
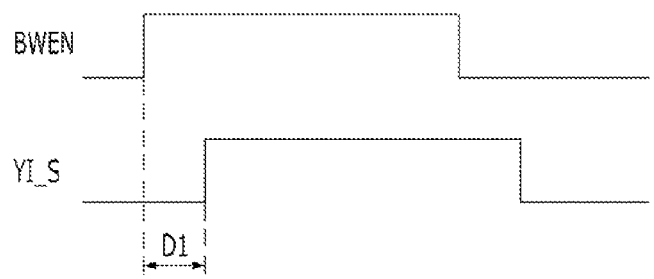
FIGS. 2A and 2B are timing diagrams for explaining an operation of a semiconductor device illustrated in FIG. 1.
Figure 2B:
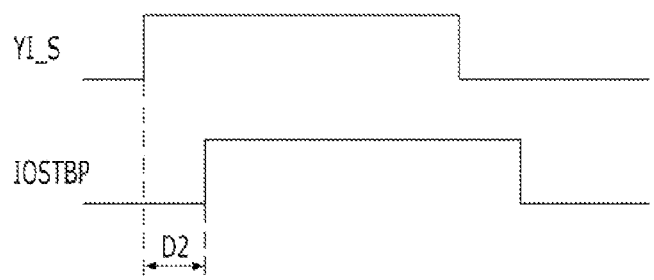

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
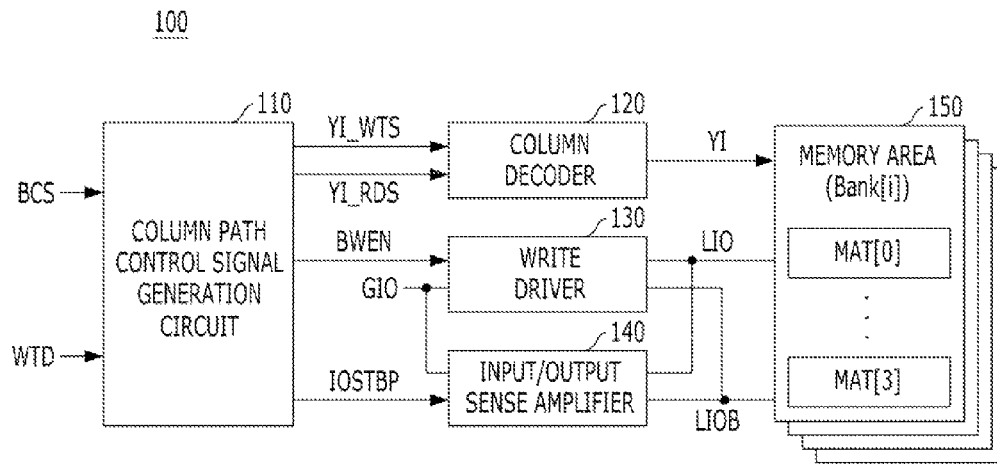
FIG. 3 is a block diagram illustrating a semiconductor device in accordance with an embodiment of the present invention.

FIG. 3 is a block diagram illustrating a semiconductor device in accordance with an embodiment of the present invention.

Referring to FIG. 3, a semiconductor device 100 includes a column path control signal generation circuit 110, a column decoder 120, a write driver (WD) 130, an input/output sense amplifier (IOSA) 140, and a memory area 150. The column path control signal generation circuit 110 is configured to generate a column source signal for write operation (hereinafter, referred to as "write column source signal YI_WTS), a column source signal for read operation (hereinafter, referred to as "read column source signal YI_RDS) a write enable signal BWEN, and a read enable signal IOSTBP in response to a source signal BCS and a write/read discrimination signal WTD. The column decoder 120 is configured to generate a column selection signal VI in response to the write column source signal YI_WTS and the read column source signal YI_RDS. The write driver 130 is configured to transfer data loaded on a global input/output line GIO to a local input/output line pair LIO and LIOB in response to the write enable signal BWEN. The input/output sense amplifier 140 is configured to transfer data loaded on the local input/output line pair LIO and LIOB to the global input/output line GIO in response to the read enable signal IOSTBP. The memory area 150 is configured to store the data loaded on the local input/output line pair LTO and LIOB therein in response to the column selection signal VI, or provides the local input/output line pair LIO and LIOB with the data stored therein.

Since the column decoder 120, the write driver 130, the input/output sense amplifier 140, and the memory area 150 are well known in the art, a detailed description thereof will be omitted. The memory area 150 will be described as an example of an arbitrary bank Bank[i] including first to fourth mats MAT[0] to MAT[3].

Figure 4:
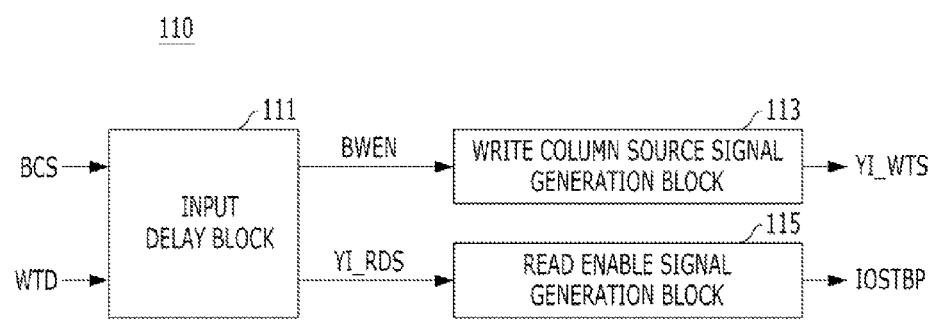
FIG. 4 is an internal configuration diagram illustrating a column control circuit illustrated in FIG. 3.

FIG. 4 is a detailed block diagram of the column path control signal generation circuit 110 shown in FIG. 3.

Referring to FIG. 4, the column path control signal generation circuit 110 includes an input delay block 111, a write column source signal generation block 113, a read enable signal generation block 115. The input delay block 111 is configured to generate the write enable signal BWEN delayed by a predetermined delay time as compared with the source signal BCS in a write operation, and to generate the read column source signal YI_RDS delayed by a predetermined delay time as compared with the source signal BCS in a read operation, in response to the source signal BCS and the write/read discrimination signal WTD. The write column source signal generation block 113 is configured to generate the write column source signal YI_WTS that has reflected a delay time corresponding to the arrangement locations of the first to fourth mats MAT[0] to MAT[3], in response to the write enable signal BWEN. The read enable signal generation block 115 is configured to generate the read enable signal IOSTBP that has reflected the delay time corresponding to the arrangement locations of the first to fourth mats MAT[0] to MAT[3], response to the read column source signal YI_RDS.

Figure 5:
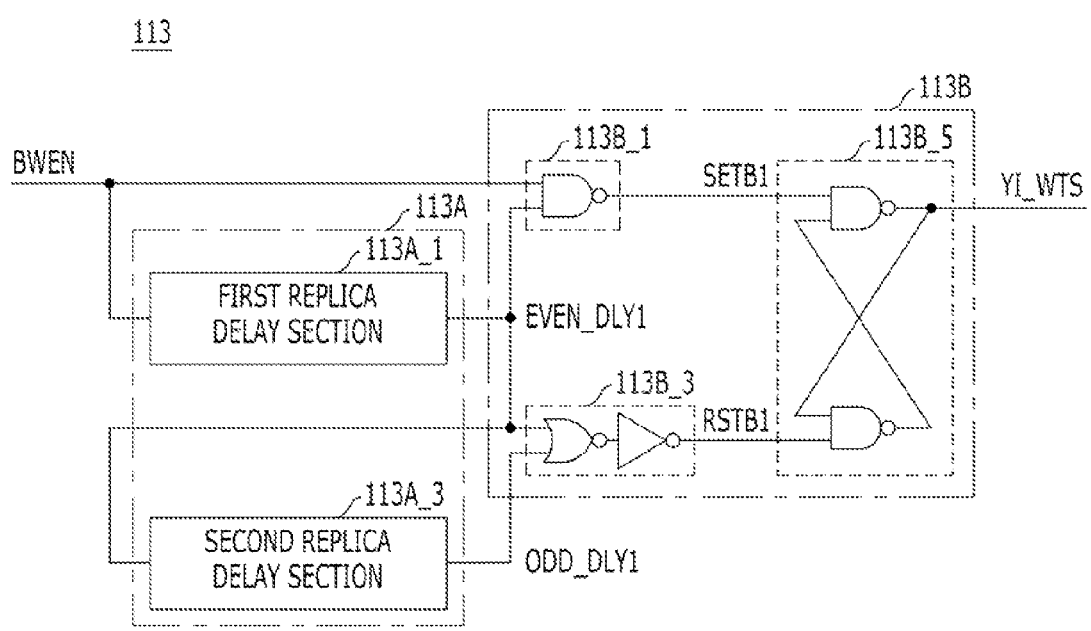
FIG. 5 is an internal configuration diagram illustrating a column source signal generation block for write illustrated in FIG. 4.
Figure 6:
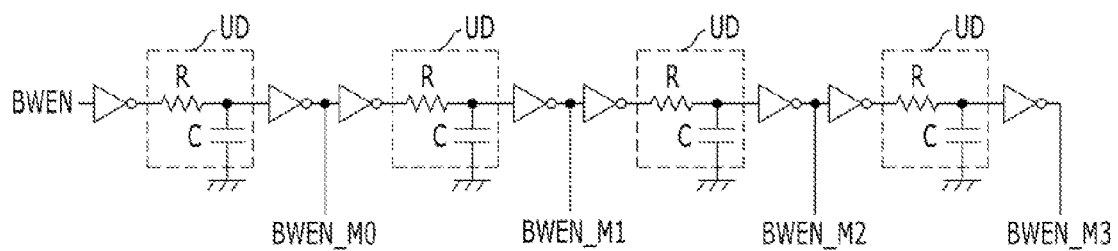
FIG. 6 is an internal configuration diagram illustrating a first replica delay section illustrated in FIG. 5.
Figure 6:
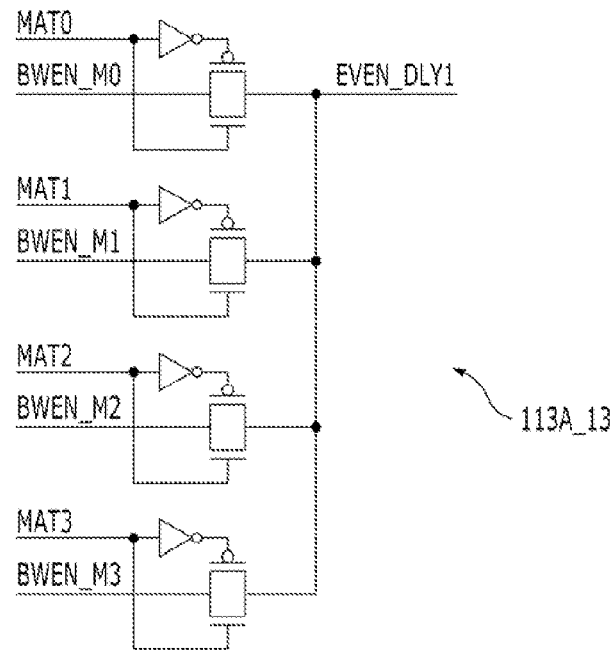
Figure 7:
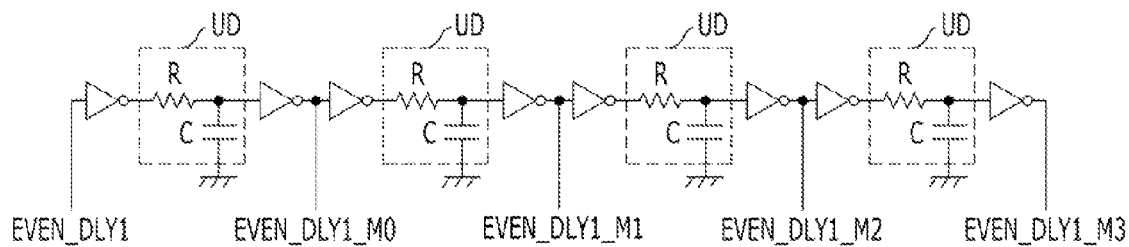
FIG. 7 is an internal configuration diagram illustrating a second replica delay section illustrated in FIG. 5.
Figure 7:
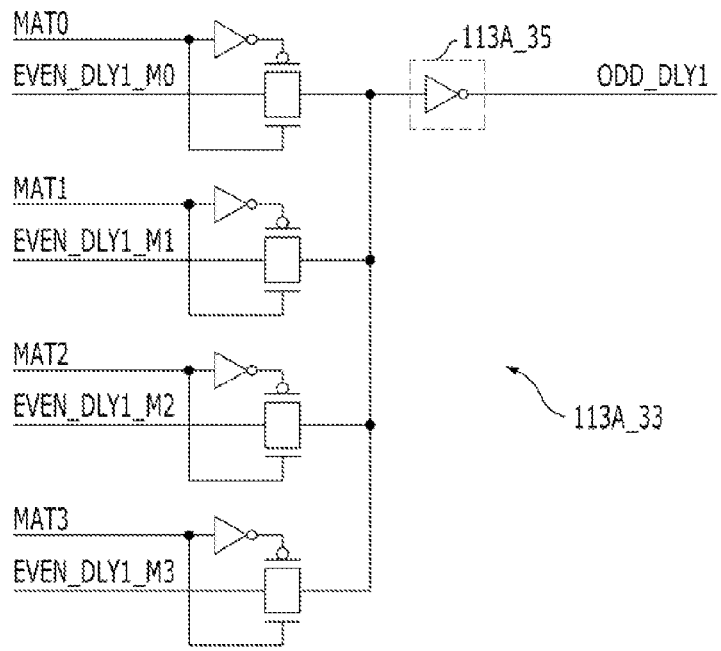

FIG. 5 is a detailed diagram illustrating the write column source signal generation block 113 shown in FIG. 4. FIG. 6 is a detailed circuit diagram illustrating a first replica delay section shown in FIG. 5. FIG. 7 is a detailed circuit diagram illustrating a second replica delay section shown in FIG. 5.

Referring to FIG. 5, the write column source signal generation block 113 includes a first signal generation unit 113A and a second signal generation unit 113B. The first signal generation unit 113A is configured to sequentially generate a first delay signal EVEN_DLY1 and a second delay signal ODD_DLY1 in response to the write enable signal BWEN, wherein a delay time selected from a plurality of delay times in correspondence with the arrangement locations of the arbitrary mats MAT[0] to MAT[3], through data is input/output, is reflected in the first and second delay signals EVEN_DLY1 and ODD_DLY1 as multiples different from each other. The second signal generation unit 113B is configured to generate the write column source signal YI_WTS delayed by the selected delay time as compared with the write enable signal BWEN, to determine an activation time point of the write column source signal YI_WTS in response to the first delay signal EVEN_DLY1, and to determine a deactivation time point of the write column source signal YI_WTS in response to the second delay signal ODD_DLY1. The various delay times include delay times in which a local input/output line LIO or LIOB has been modeled corresponding to the arrangement locations of the first to fourth mats MAT[0] to MAT[3].

The first signal generation unit 113A includes a first replica delay section 113A_1 and a second replica delay section 113A_3. The first replica delay section 113A_1 is configured to delay the write enable signal BWEN by delay times corresponding to the arrangement locations of the first to fourth mats MAT[0] to MAT[3], and to generate the first delay signal EVEN_DLY1. The second replica delay section 113A_3 is configured to delay the first delay signal EVEN_DLY1 by the delay times corresponding to the arrangement locations of the first to fourth mats MAT[0] to MAT[3], and to generate the second delay signal ODD_DLY1. At this time, the first delay signal EVEN_DLY1 may be delayed once as long as the delay time as compared with the write enable signal BWEN, and the second delay signal ODD_DLY1 may be delayed twice as long as the delay time as compared with the write enable signal BWEN.

As illustrated in FIG. 6, the first replica delay section 113A_1 includes a first modeling part 113A_11 and a first selection part 113A_13. The first modeling part 113A_11 is configured to include a plurality of unit delay cells UDs coupled in series, and to provide a plurality of delay paths in which different delay times have been modeled corresponding to the arrangement locations of the first to fourth mats MAT[0] to MAT[3]. The first selection part 113A_13 is configured to select one of a plurality of delayed write enable signals BWEN_M0 to BWEN_M3, which are output through the plurality of delay paths, based on first to fourth mat selection signals MAT0 to MAT3, and to output the selected signal as the first delay signal EVEN_DLY1. Each unit delay cell UD includes an RC delay.

As illustrated in FIG. 7, the second replica delay section 113A_3 includes a second modeling part 113A_31, a second selection part 113A_33, and a first inversion part 113A_35. The second modeling part 113A_31 is configured to have a plurality of unit delay cells UDs coupled in series, and to provide a plurality of delay paths in which different delay times have been modeled corresponding to the arrangement locations of the first to fourth mats MAT[0] to MAT[3]. The second selection part 113A_33 is configured to select one of a plurality of delayed first delay signals EVEN_DLY1_M0 to EVEN_DLY1_M3, which are output through the plurality of delay paths, based on the first to fourth mat selection signals MAT0 to MAT3. The first inversion part 113A_35 is configured to invert the signal selected by the second selection part 113A_33 and to output the inverted signal as the second delay signal ODD_DLY1. Each unit delay cell UD includes an RC delay.

Referring back to FIG. 5, the second signal generation unit 113B includes a first logic operation section 113B_1, a second logic operation section 113B_3, and a third logic operation section 113B_5. The first logic operation section 113B_1 is configured to perform a logic operation on the write enable signal BWEN and the first delay signal EVEN_DLY1 to generate a first set signal SETB1. The second logic operation section 113B_3 is configured to perform a logic operation on the first delay signal EVEN_DLY1 and the second delay signal ODD_DLY1 to generate a first reset signal RSTB1. The third logic operation section 113B_5 is configured to perform a logic operation on the first set signal SETB1 and the first reset signal RSTB1 to generate the write column source signal YI_WTS.

The first logic operation section 113B_1 includes a NAND gate configured to perform a NAND operation on the write enable signal BWEN and the first delay signal EVEN_DLY1 to output the first set signal SETB1.

The second logic operation section 113B_3 includes a NOR gate configured to perform a NOR operation on the first delay signal EVEN_DLY1 and the second delay signal ODD_DLY1, and an inverter configured to invert an output signal of the NOR gate to output the first reset signal RSTB1.

The third logic operation section 113B_5 includes an SR latch with cross-coupled NAND gates. One NAND gate is configured to perform a NAND operation on the first set signal SETB1 and an output signal of the other NAND gate to output the write column source signal YI_WTS, and the other NAND gate configured to perform a NAND operation on the first reset signal RSTB1 and the write column source signal YI_WTS. As a result, the third logic operation section 113B_5 generates the write column source signal YI_WTS that is activated in response to a falling edge of the first set signal SETB1 and deactivated in response to a falling edge of the first reset signal RSTB1.

Figure 8:
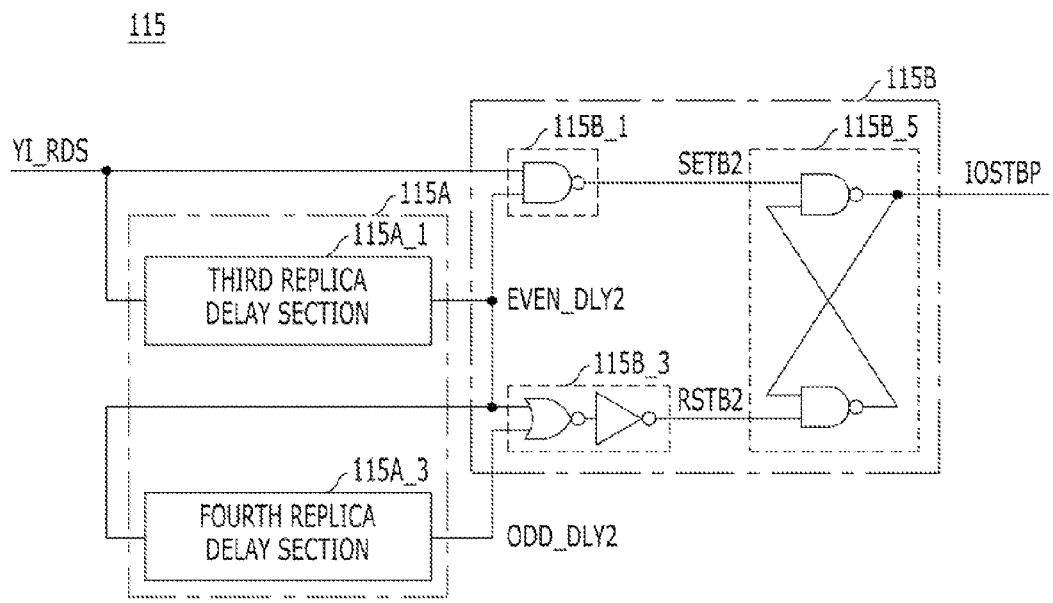
FIG. 8 is an internal configuration diagram illustrating a read enable signal generation block illustrated in FIG. 4.

FIG. 8 is a detailed diagram illustrating the read enable signal generation block 115 shown in FIG. 4.

Referring to FIG. 8, the read enable signal generation block 115 includes a third signal generation unit 115A and a fourth signal generation unit 115B. The third signal generation unit 115A is configured to sequentially generate a third delay signal EVEN_DLY2 and a fourth delay signal ODD_DLY2 in response to the read column source signal YI_RDS, wherein a delay time selected from a plurality of delay times in correspondence with the arrangement locations of the arbitrary mats MAT[0] to MAT[3], through data is input/output, is reflected in the third and fourth delay signals EVEN_DLY2 and ODD_DLY2 as multiples different from each other. The fourth signal generation unit 115B is configured to generate the read enable signal IOSTBP delayed by the selected delay time as compared with the read column source signal YI_RDS, to determine an activation time point of the read enable signal IOSTBP in response to the third delay signal EVEN_DLY2, and to determine a deactivation time point of the read enable signal IOSTBP in response to the fourth delay signal ODD_DLY2. The plurality of delay times include delay times in which the local input/output line LIO or LIOB has been modeled corresponding to the arrangement locations of the first to fourth mats MAT[0] to MAT[3].

The third signal generation unit 115A includes a third replica delay section 115A_1 and a fourth replica delay section 115A_3. The third replica delay section 115A_1 is configured to delay the read column source signal YI_RDS by the delay times corresponding to the arrangement locations of the first to fourth mats MAT[0] to MAT[3], and to generate the third delay signal EVEN_DLY2. The fourth replica delay section 115A_3 is configured to delay the third delay signal EVEN_DLY2 by the delay times corresponding to the arrangement locations of the first to fourth mats MAT[0] to MAT[3], and to generate the fourth delay signal ODD_DLY2. At this time, the third delay signal EVEN_DLY2 may be delayed once as long as the delay time as compared with the read column source signal YI_RDS, and the fourth delay signal ODD_DLY2 may be delayed twice as long as the delay time as compared with the read column source signal YI_RDS.

Since the third and fourth replica delay sections 115A_1 and 115A_3 have substantially the same configurations as those of the first and second replica delay sections 113A_1 and 113A_3 described above, a detailed description thereof will be omitted (refer to FIG. 6 and FIG. 7).

The fourth signal generation unit 115B includes a fourth logic operation section 115B_1 a fifth logic operation section 115B_3 and a sixth logic operation section 115B_5. The fourth logic operation section 115B_1 is configured to perform a logic operation on the read column source signal YI_RDS and the third delay signal EVEN_DLY2 to generate a second set signal SETB2. The fifth logic operation section 115B_3 is configured to perform a logic operation on the third delay signal EVEN_DLY2 and the fourth delay signal ODD_DLY2 to generate a second reset signal RSTB2. The sixth logic operation section 115B_5 is configured to perform a logic operation on the second set signal SETB2 and the second reset signal RSTB2 to generate the read enable signal IOSTBP.

Since the fourth to sixth logic operation sections 115B_1, 115B_3, and 115B_5 have substantially the same configurations as those of the first to third replica delay sections 113B_1, 113B_3, and 113B_5 described above, a detailed description thereof will be omitted.

Hereinafter, an operation of the semiconductor device 100 in accordance with the embodiment of the present invention having the configuration as described above will be described with reference to FIG. 9 and FIG. 10.

Figure 9:
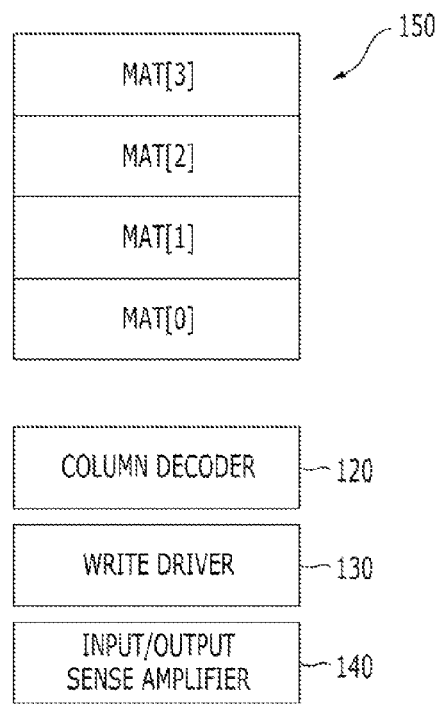
FIG. 9 is a block diagram illustrating an arrangement relation of a column decoder and a plurality of mats illustrated in FIG. 3.
Figure 10:
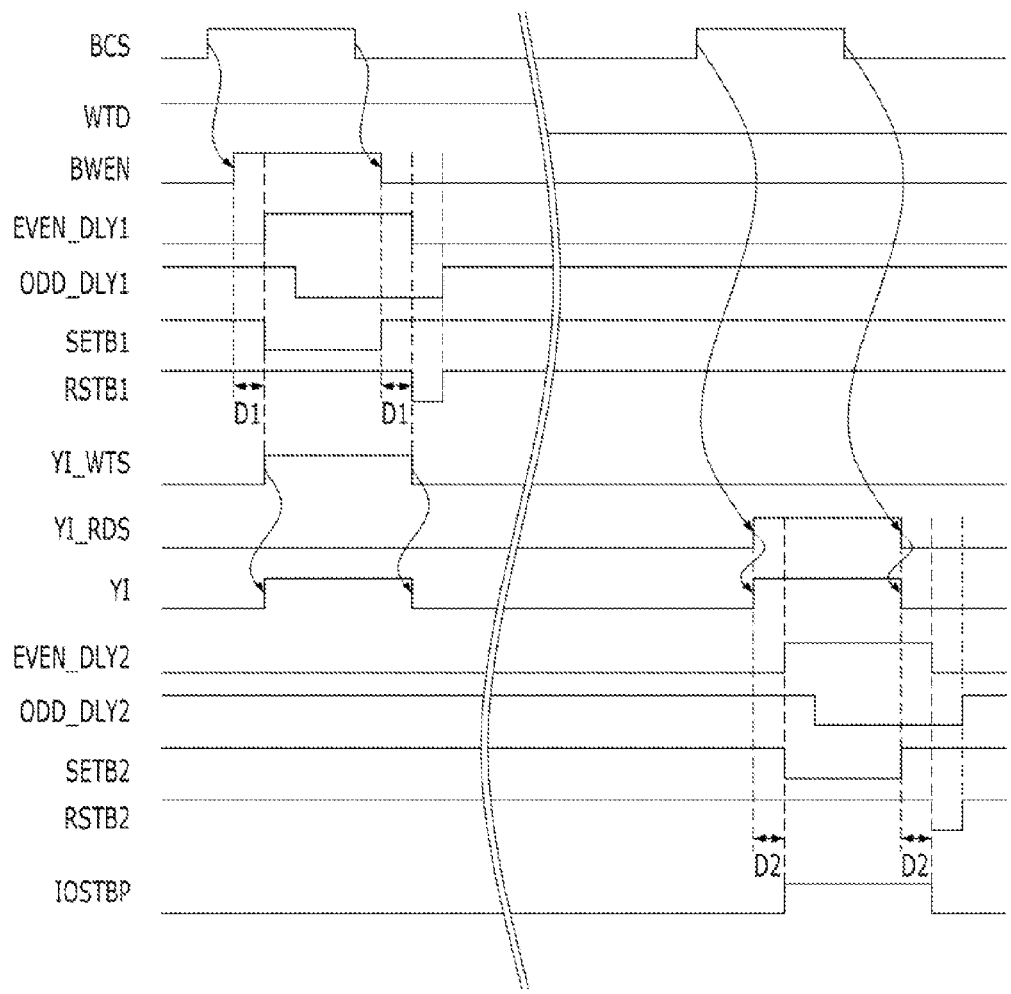
FIG. 10 is a timing diagram for explaining an operation of a semiconductor device in accordance with an embodiment of the present invention.

FIG. 9 is a block diagram illustrating an arrangement relation of the column decoder 120, the write driver 130, the input/output sense amplifier 140, and the first to fourth mats MAT[0] to MAT[3] illustrated in FIG. 3. FIG. 10 is a timing diagram illustrating the operation of the semiconductor device 100 in accordance with the embodiment of the present invention.

In the embodiment of the present invention, a description will be provided for an example in which the first to fourth mats MAT[0] to MAT[3] are sequentially arranged in a direction most distant from the column decoder 120, the write driver 130, and the input/output sense amplifier 140 as illustrated in FIG. 9. In other words, the first mat. MAT[0] is arranged nearest the column decoder 120, the write driver 130, and the input/output sense amplifier 140, and the fourth mat MAT[3] is arranged farthest from column decoder 120, the write driver 130, and the input/output sense amplifier 140.

Referring to FIG. 10, in the write operation, a write command (not illustrated) is applied, and the source signal BCS is activated after predetermined latency. For example, in the write operation, the write/read discrimination signal WTD has a logic high level.

The input delay block 111 generates the write enable signal BWEN after a predetermined delay time in response to the write/read discrimination signal WTD and the source signal BCS, and the write column source signal generation block 113 generates the write column source signal YI_WTS in response to the write enable signal BWEN.

A process for generating the write column source signal YI_WTS will be described in more detail.

The first replica delay section 113A_1 delays the write enable signal BWEN by a delay time D1 modeled corresponding to an arrangement location of a mat (hereinafter, referred to as a 'first selected mat MAT[x]'), in which data is to be written, of the first to fourth mats MAT[0] to MAT[3], and generates the first delay signal EVEN_DLY1. The second replica delay section 113A_3 delays the first delay signal EVEN_DLY1 by the delay time D1 modeled corresponding to the arrangement location of the first selected mat MAT[x] and generates the second delay signal ODD_DLY1. The second delay signal ODD_DLY1 is generated to have a phase opposite to that of the first delay signal EVEN_DLY1. Subsequently, when the first logic operation section 113B_1 performs a NAND operation on the write enable signal BWEN and the first delay signal EVEN_DLY1 to generate the first set signal SETB1 and the second logic operation section 113B_3 performs an OR operation on the first and second delay signals EVEN_DLY1 and ODD_DLY1 to generate the first reset signal RSTB1, the third logic operation section 113B_5 generates the write column source signal YI_WTS that is activated in response to the first set signal SETB1 and is deactivated in response to the first reset signal RSTB1. Meanwhile, the delay time D1 corresponding to the arrangement location of the first selected mat MAT[x] is reflected in the first and second delay signals EVEN_DLY1 and ODD_DLY1 through the delayed path modeled using the RC delay. For example, a delay time D1, which is relatively large delay value, is reflected for the first selected mat MAT[x], which is a mat arranged far away from the write driver 130.

Meanwhile, the write driver 130 transfers data (not illustrated) loaded on the global input/output line GIO to the local input/output line pair LIO and LIOB in response to the write enable signal BWEN, and the column decoder 120 generates the column selection signal VI in response to the write column source signal YI_WTS. Then, the first selected mat MAT[x] stores the data loaded on the local input/output line pair LIO and LIOB in response to the column selection signal YI.

In the read operation, a read command (not illustrated) is applied, and the source signal BCS is activated after predetermined latency. For example, in the read operation, the write/read discrimination signal WTD has a logic low level.

The input delay block 111 generates the read column source signal YI_RDS after a predetermined delay time in response to the write/read discrimination signal WTD and the source signal BCS, and the read enable signal generation block 115 generate the read enable signal IOSTBP in response to the read column source signal YI_RDS.

A process of generating the read enable signal IOSTBP will be described in more detail.

The third replica delay section 115A_1 delays the read column source signal YI_RDS by a delay time D2 modeled corresponding to an arrangement location of a mat (hereinafter, referred to as a 'second selected mat MAT[y]'), from which data is to be read, of the first to fourth mats MAT[0] to MAT[3], and generates the third delay signal EVEN_DLY2. The fourth replica delay section 115A_3 delays the third delay signal EVEN_DLY2 by the delay time D2 modeled corresponding to the arrangement location of the second selected mat MAT[y], and generates the fourth delay signal ODD_DLY2. The fourth delay signal ODD_DLY2 is generated to have a phase opposite to that of the third delay signal EVEN_DLY2. Subsequently, when the fourth logic operation section 115B_1 performs a NAND operation on the read column source signal YI_RDS and the third delay signal EVEN_DLY2 to generate the second set signal SETB2 and the fifth logic operation section 115B_3 performs an OR operation on the third and fourth delay signals EVEN_DLY2 and ODD_DLY2 to generate the second reset signal RSTB2, the sixth logic operation section 115B_5 generates the read enable signal IOSTBP that is activated in response to the second set signal SETB2 and is deactivated in response to the second reset signal RSTB2. Meanwhile, the delay time D2 corresponding to the arrangement location of the second selected mat MAT[y] is reflected in the third and fourth delay signals EVEN_DLY2 and ODD_DLY2 through the delayed path modeled using the RC delay, and a delay time D2 largely modeled is reflected as the second selected mat MAT[y] is a mat arranged far away from the input/output sense amplifier 140.

Meanwhile, the column decoder 120 generates the column selection signal YI in response to the read column source signal YI_RDS. Then, the second selected mat MAT[y] transfers data to be read to the local input/output line pair LIO and LIOB in response to the column selection signal YI. The input/output sense amplifier 140 transfers the data loaded on the local input/output line pair LIO and LIOB to the global input/output line GIO in response to the read enable signal IOSTBP.

In accordance with the embodiment of the present invention, in consideration of line loading of the local input/output line LIO or LIOB when data is transmitted through the local input/output line pair LIO and LIOB, the generation timing of the column selection signal YI is adjusted in the write operation and the generation timing of the read enable signal IOSTBP is adjusted in the read operation, so that valid data may be written and read. Furthermore, since the RC delay may be used as a delay factor modeled corresponding to the line loading of the local input/output line LIO or LIOB, the semiconductor memory device is insensitive to a PVT variation, so that a margin between the write enable signal BWEN and the column selection signal VI and a margin between the column selection signal VI and the read enable signal IOSTBP are constantly maintained at all times regardless of the PVT variation.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device comprising:
    a first replica delay section configured to delay a write enable signal by a delay time corresponding to arrangement locations of a plurality of unit memory regions to generate a first delay signal;
    a second replica delay section configured to delay the first delay signal by the delay time to generate a second delay signal;
    a column source signal generation unit configured to generate a first column source signal, which is delayed by the delay time as compared with the write enable signal, in response to the write enable signal and the first and second delay signals; and
    a column decoder configured to generate a column selection signal for write operation in response to the first column source signal,
    wherein the column source signal generation unit comprises:
    a first logic operation section configured to perform a first logic operation on the write enable signal and the first delay signal to generate a first set signal;
    a second logic operation section configured to perform a second logic operation on the first delay signal and the second delay signal to generate a first reset signal; and
    a third logic operation section configured to perform a third logic operation on the first set signal and the first reset signal to generate the first column source signal,
    wherein the first delay signal has a first delay phase substantially equal to a phase of the write enable signal, and the second delay signal has a second delay phase different from the phase of the write enable signal.

2. The semiconductor memory device of claim 1, further comprising:
    a write driver configured to transfer data loaded on a global input/output line to a local input/output line in response to the write enable signal,
    wherein the delay time is more largely reflected as the arrangement locations of the plurality of unit memory regions are more far away from the write driver.

3. The semiconductor memory device of claim 2, wherein the first and second replica delay sections model the local input/output line.

4. The semiconductor memory device of claim 1, wherein the first replica delay section comprises:
    a first modeling part configured to have a plurality of unit delay cells coupled in series, and to provide a plurality of delay paths in which different delay times have been modeled corresponding to the arrangement locations of the plurality of unit memory regions; and
    a first selection part configured to select one of a plurality of delayed write enable signals, which are output through the plurality of delay paths, based on at least one selection signal, and to output the selected signal as the first delay signal.

5. The semiconductor memory device of claim 4, wherein the plurality of unit delay cells include an RC delay.

6. The semiconductor memory device of claim 4, wherein the plurality of unit memory regions correspond to a plurality of mats included in a bank, and the selection signal is applied corresponding to a mat, in which data is written, of the plurality of mats.

7. The semiconductor memory device of claim 1, wherein the second replica delay section comprises:
- a second modeling part configured to have a plurality of unit delay cells coupled in series, and to provide a plurality of delay paths in which different delay times have been modeled corresponding to the arrangement locations of the plurality of unit memory regions;
- a second selection part configured to select one of a plurality of delayed first delay signals, which are output through the plurality of delay paths, based on the selection signal; and
- a first inversion part configured to invert the signal selected by the second selection part, and to output the inverted signal as the second delay signal.

8. The semiconductor memory device of claim 1, wherein the third logic operation section includes an SR latch.

9. The semiconductor memory device of claim 1, wherein the column decoder is configured to generate a column selection signal for read operation in response to a second column source signal, and the semiconductor memory device further comprises:
- an input delay block configured to generate the write enable signal and the second column source signal in response to a write/read discrimination signal and a source signal;
- a third replica delay section configured to delay the second column source signal by the delay time to generate a third delay signal
- a fourth replica delay section configured to delay the third delay signal by the delay times to generate a fourth delay signal; and
- a read enable signal generation unit configured to generate a read enable signal delayed by the delay time as compared with the second column source signal in response to the second column source signal and the third and fourth delay signals.

10. The semiconductor memory device of claim 9, further comprising:
- an input/output sense amplifier (IDSA) configured to transfer data loaded on a local input/output line to a global input/output line in response to the read enable signal,
- wherein the delay time becomes larger as the arrangement locations of the plurality of unit memory regions become more distant from the input/output sense amplifier.

11. The semiconductor memory device of claim 10, wherein the third and fourth replica delay sections model the local input/output line.

12. The semiconductor memory device of claim 9, wherein the third replica delay section comprises:
- a third modeling part configured to have a plurality of unit delay cells coupled in series, and to provide a plurality of delay paths in which different delay times have been modeled corresponding to the arrangement locations of the plurality of unit memory regions; and
- a third selection part configured to select one of a plurality of delayed second column source signals, which are output through the plurality of delay paths, based on at least one selection signal, and to output the selected signal as the third delay signal.

13. The semiconductor memory device of claim 12, wherein the plurality of unit delay cells include an RC delay.

14. The semiconductor memory device of claim 12, wherein the plurality of unit memory regions correspond to a plurality of mats included in a bank, and the selection signal is applied corresponding to a mat, from which data is read, of the plurality of mat.

15. The semiconductor memory device of claim 9, wherein the fourth replica delay section comprises:
- a fourth modeling part configured to have a plurality of unit delay cells coupled in series, and to provide a plurality of delay paths in which different delay times have been modeled corresponding to the arrangement locations of the plurality of unit memory regions;
- a fourth selection part configured to select one of a plurality of delayed third delay signals, which are output through the plurality of delay paths, based on the selection signal; and
- a second inversion part configured to invert the signal selected by the fourth selection part, and to output the inverted signal as the fourth delay signal.

16. The semiconductor memory device of claim 9, wherein the read enable signal generation unit comprises:
- a fourth logic operation section configured to perform a fourth logic operation on the second column source signal and the third delay signal to generate a second set signal;
- a fifth logic operation section configured to perform a fifth logic operation on the third delay signal and the fourth delay signal to generate a second reset signal; and
- a sixth logic operation section configured to perform a sixth logic operation on the second set signal and the second reset signal to generate the read enable signal.

17. The semiconductor memory device of claim 16, wherein the sixth logic operation section includes an SR latch.

18. The semiconductor memory device of claim 16, wherein the third delay signal has a third delay phase substantially equal to a second phase of the second column source signal, and the fourth delay signal has a fourth delay phase different from the second phase of the second column source signal.

19. A semiconductor memory device comprising:
- a first replica delay section configured to delay a write enable signal by a delay time adaptively selected corresponding to arrangement locations of a plurality of unit memory regions, based on a selection signal for selecting target unit memory regions, to generate a first delay signal;
- a second replica delay section configured to delay the first delay signal by the delay time to generate a second delay signal;
- a column source signal generation unit configured to generate a first column source signal, which is delayed by the delay time as compared with the write enable signal, in response to the write enable signal and the first and second delay signals; and
- a column decoder configured to generate a column selection signal for write operation in response to the first column source signal,
- wherein the first replica delay section comprises:
  - a first modeling part configured to have a plurality of unit delay cells coupled in series, and to provide a plurality of delay paths in which different delay times have been modeled corresponding to the arrangement locations of the plurality of unit memory regions; and a first selection part configured to select one of a plurality of delayed write enable signals, which are output through the plurality of delay paths, based on the selection signal, and to output the selected signal as the first delay signal wherein the first delay signal has a first delay phase substantially equal to a phase of the write enable signal, and the second delay signal has a second delay phase different from the phase of the write enable signal.

20. The semiconductor memory device of claim 19, wherein an activation time point of the write column source signal is determined in response to the first delay signal, and a deactivation time point of the write column source signal is determined in response to the second delay signal.

21. The semiconductor memory device of claim 19, wherein the plurality of unit delay cells include an RC delay.

22. The semiconductor memory device of claim 19, wherein the plurality of unit memory regions correspond to a plurality of mats included in a bank, and the selection signal is applied corresponding to a mat, in which data is written, of the plurality of mats.

23. The semiconductor memory device of claim 19, wherein the column decoder is configured to generate the column selection signal for read operation in response to a second column source signal, and the semiconductor memory device further comprises:
   an input delay block configured to generate the write enable signal and the second column source signal in response to a write/read discrimination signal and a source signal;
   a third replica delay section configured to delay the second column source signal by the delay time to generate a third delay signal
   a fourth replica delay section configured to delay the third delay signal by the delay times to generate a fourth delay signal; and
   a read enable signal generation unit configured to generate a read enable signal delayed by the delay time as compared with the second column source signal in response to the second column source signal and the third and fourth delay signals.

24. The semiconductor memory device of claim 23, wherein the fourth replica delay section comprises:
   a fourth modeling part configured to have a plurality of unit delay cells coupled in series, and to provide a plurality of delay paths in which different delay times have been modeled corresponding to the arrangement locations of the plurality of unit memory regions;
   a fourth selection part configured to select one of a plurality of delayed third delay signals, which are output through the plurality of delay paths, based on the selection signal; and
   a second inversion part configured to invert the signal selected by the fourth selection part, and to output the inverted signal as the fourth delay signal.

* * * * *